(12) United States Patent
Hu et al.

(10) Patent No.: US 9,069,034 B2
(45) Date of Patent: Jun. 30, 2015

(54) SPINTRONIC PHASE COMPARATOR PERMITTING DIRECT PHASE PROBING AND MAPPING OF ELECTROMAGNETIC SIGNALS

(75) Inventors: Can-Ming Hu, Winnipeg (CA); Andre Wirthmann, Vancouver (CA); Xiaolong Fan, Lanzhou (CN); Yongsheng Gui, Winnipeg (CA)

(73) Assignee: University of Manitoba, Winnipeg (CA)

( * ) Notice: Subject to any disclaimer, the term of this patent is extended or adjusted under 35 U.S.C. 154(b) by 993 days.

(21) Appl. No.: 13/163,551

(22) Filed: Jun. 17, 2011

(65) Prior Publication Data

US 2012/0001656 A1   Jan. 5, 2012

Related U.S. Application Data

(60) Provisional application No. 61/360,479, filed on Jun. 30, 2010.

(51) Int. Cl.
*H03D 13/00* (2006.01)
*H05K 3/30* (2006.01)
*G01R 33/12* (2006.01)

(52) U.S. Cl.
CPC .............. *G01R 33/1284* (2013.01); *H05K 3/30* (2013.01); *H03D 13/00* (2013.01)

(58) Field of Classification Search
USPC ......... 324/300–322, 244, 248–250, 260, 645, 324/646; 600/407–435; 382/128–131; 257/15, 14, 20, 428; 250/287; 327/3; 29/82

See application file for complete search history.

(56) References Cited

U.S. PATENT DOCUMENTS

| | | | | |
|---|---|---|---|---|
| 5,365,391 A * | 11/1994 | Sugiyama et al. | ............ | 360/110 |
| 6,952,380 B2 * | 10/2005 | Isshiki et al. | ............... | 369/13.33 |
| 7,180,418 B1 * | 2/2007 | Willms et al. | ............ | 340/568.1 |
| 7,203,618 B2 | 4/2007 | Hammerschmidt et al. | .. | 702/151 |
| 7,268,563 B2 * | 9/2007 | Hariharan et al. | ............ | 324/631 |
| 7,408,344 B2 | 8/2008 | Tokuhara | ...................... | 324/252 |
| 7,986,140 B2 | 7/2011 | Hu et al. | .................. | 324/207.25 |
| 8,779,765 B2 * | 7/2014 | Grachev et al. | ............... | 324/300 |
| 8,803,366 B2 * | 8/2014 | Proud | ........................... | 307/104 |
| 8,828,792 B2 * | 9/2014 | Drndic et al. | ................... | 438/99 |

(Continued)

OTHER PUBLICATIONS

Azevedo et al., "dc effect in ferromagnetic resonance: evidence of the spin-pumping effect?" *J. Appl. Phys.*, 97:10C715, 2005.

(Continued)

*Primary Examiner* — Patrick Assouad
*Assistant Examiner* — Tiffany Fetzner
(74) *Attorney, Agent, or Firm* — Norton Rose Fulbright US LLP

(57) ABSTRACT

An apparatus, system, and method for phase detection of electromagnetic signals are presented. The apparatus may include a magnetic element, one or more first signal contacts coupled to the magnetic element for receiving a first signal, and one or more output contacts coupled to the magnetic element for providing a variable level voltage generated by the magnetic element, the level of the voltage being responsive to a phase difference between the first signal and a second signal. In a further embodiment, the apparatus may include a substrate for mechanically supporting the magnetic element. Additionally, the apparatus may include a conductor mechanically supported by substrate, the conductor configured to receive the second signal.

40 Claims, 11 Drawing Sheets

(56) References Cited

U.S. PATENT DOCUMENTS

| | | | |
|---|---|---|---|
| 8,890,737 B2* | 11/2014 | Schrom et al. | 341/144 |
| 2002/0044353 A1* | 4/2002 | Salzman | 359/488 |
| 2002/0114032 A1* | 8/2002 | Salzman | 359/122 |
| 2003/0043699 A1* | 3/2003 | Isshiki et al. | 369/13.33 |
| 2005/0215764 A1* | 9/2005 | Tuszynski et al. | 530/358 |
| 2005/0249667 A1* | 11/2005 | Tuszynski et al. | 424/9.3 |
| 2006/0020371 A1* | 1/2006 | Ham et al. | 700/266 |
| 2006/0138397 A1* | 6/2006 | Mattis | 257/15 |
| 2007/0046297 A1* | 3/2007 | Hariharan et al. | 324/631 |
| 2008/0017845 A1* | 1/2008 | Drndic et al. | 360/110 |
| 2010/0006439 A1* | 1/2010 | Ham et al. | 204/547 |
| 2011/0042712 A1* | 2/2011 | Wang | 369/13.33 |
| 2011/0175605 A1* | 7/2011 | Kim et al. | 324/251 |
| 2011/0189440 A1* | 8/2011 | Appleby et al. | 428/156 |
| 2012/0001656 A1* | 1/2012 | Hu et al. | 327/3 |
| 2013/0278076 A1* | 10/2013 | Proud | 340/568.1 |
| 2013/0293227 A1* | 11/2013 | Grachev et al. | 369/13.33 |
| 2013/0338267 A1* | 12/2013 | Appleby et al. | 523/458 |
| 2014/0184196 A1* | 7/2014 | Lieber et al. | 530/358 |
| 2014/0246502 A1* | 9/2014 | Proud | 424/9.3 |
| 2014/0247137 A1* | 9/2014 | Proud | 700/266 |
| 2014/0247148 A1* | 9/2014 | Proud | 257/15 |
| 2014/0247152 A1* | 9/2014 | Proud | 204/547 |
| 2014/0249825 A1* | 9/2014 | Proud | 324/251 |
| 2014/0254734 A1* | 9/2014 | Abdelmoneum et al. | 428/156 |
| 2014/0266119 A1* | 9/2014 | Burton et al. | 327/3 |
| 2014/0266832 A1* | 9/2014 | Schrom et al. | 523/458 |

OTHER PUBLICATIONS

Bai et al., "The rf magnetic-field vector detector based on the spin rectification effect," *Applied Physics Letters*, 92:32504, 2008.

Berger, "Emission of spin waves by a magnetic multilayer traversed by a current," *Phys. Rev. B.*, 54:9353, 1996.

Berger, "Generation of dc voltages by a magnetic multilayer undergoing ferromagnetic resonance," *Phys. Rev. B.*, 59:11465, 1999.

Brataas et al., "Spin battery operated by ferromagnetic resonance," *Phys. Rev. B.*, 66:060404 (R), 2002.

Camley and Mills, "Theory of microwave propagation in dielectric/magnetic film multilayer structures," *J. Appl. Phys.*, 82:3058, 1997.

Costache et al., "Electrical detection of spin pumping due to the precessing magnetization of a single ferromagnet," *Phys. Rev. Lett.*, 97:216603, 2006.

Costache et al., "Large cone angle magnetization precession of an individual nanopatterned ferromagnet with dc electrical detection," *Appl. Phys. Lett.*, 89:232115, 2006.

Egan and Juretschke, "DC detection of ferromagnetic resonance in thin nickel films," *J. Appl. Phys.*, 34:1477, 1963.

Foner, "Hall effect in permalloys," *Phys. Rev.*, 99:1079,1955.

Ganichev et al., "Spin-galvanic effect," *Nature*, 417:153-6, 2002.

Gilbert, "A phenomenological theory of damping in ferromagnetic materials," *IEEE Trans. on Magn.*, 40:3443-9, 2004.

Goennenwein et al., "Electrically detected ferromagnetic resonance," *Appl. Phys. Lett.*, 90:162507, 2007.

Grollier et al., "Microwave spectroscopy on magnetization reversal dynamics of nanomagnets with electronic detection," *J. Appl. Phys.*, 100:024316, 2006.

Gui et al., "Electrical detection of the ferromagnetic resonance: spin-rectification versus bolometric effect," *Applied Physics Letters*, 91:082503, 2007.

Gui et al., "Quantized spin excitations in a ferromagnetic microstrip from microwave photovoltage measurements," *Phys. Rev. Lett.*, 98:217603, 2007.

Gui et al., "Realization of a room-temperature spin dynamo: the spin rectification effect," *Phys. Rev. Lett.*, 98:107602, 2007.

Gui et al., "Resonances in ferromagnetic gratings detected by microwave photoconductivity," *Phys. Rev. Lett.*, 95:056807, 2005.

Gurney et al., "Spin valve giant magnetoresistive sensor materials for hard disk drives," *In:* Ultrathin Magnetic Structures IV, Chapter 6, Springer, Berlin, Chapter 6, pp. 149-175, 2004.

Gurney et al., "Magnetic switching in high-density MRAM," *In:* Ultrathin Magnetic Structures IV, Chapter 7, Springer, Berlin, pp. 177-218, 2004.

Gurney et al., "Giant magneto-resistive random-access memories based on current-in-plane devices," *In:* Ultrathin Magnetic Structures IV, Chapter 8, Springer, Berlin, pp. 219-252, 2004.

Guru and Hiziroglu, "Waveguides and cavity resonators," *In:* Electromagnetic Field Theory Fundamentals, Chapter 10, Cambridge University Press, $29^{nd}$ Ed., pp. 502-546, 2004.

Hu and Ge, "The spin-driven electrical currents," *La Physique au Canada*, 63:75-78, 2007.

Hu, "Recent progress in spin dynamics research in Canada," *Physics in Canada*, 65:29, 2009.

Hui et al., "Electric detection of ferromagnetic resonance in single crystal iron film," *Appl. Phys. Lett.*, 93:232502, 2008.

Jan, In: *Solid State Physics*, Academic, New York, pp. 15-54, 1957.

Juretschke, "Electromagnetic theory of dc effects in ferromagnetic resonance," *J. Appl. Phys.*, 31:1401, 1960.

Kiselev et al., "Microwave oscillations of a nanomagnet driven by a spin-polarized current," *Nature*, 425:380-3, 2003.

Kittel, "On the theory of ferromagnetic resonance absorption," *Phys. Rev.*, 73:155, 1948.

Kupferschmidt et al., "Theory of the spin-torque-driven ferromagnetic resonance in a ferromagnet/normal-metal/ferromagnet structure," *Phys. Rev. B.*, 74:134416, 2006.

Landau and Liftshitz, "On the theory of the dispension of magnetic permeability in ferromagnetic bodies," *Physik. Z. Sowjet.*, 8:153-169, 1935.

Lee and Rhie, "Spin pumping technique and its observation," *IEEE Trans. on Mag.*, 35:3784, 1999.

Mecking et al., "Microwave photovoltage and photoresitance effects in ferromagnetic microstrips," *Physical Review B*, 76:224430, 2007.

Moller and Juretschke, "Determination of spin-wave boundary conditions by dc effects in spin-wave resonance," *Phys. Rev. B.*, 2:2651, 1970.

Morrish, "Resonance in strongly coupled dipole systems," *In:* The Physical Principles of Magnetism, Chapter 10, IEEE Press Classic Reissue, New York, pp. 539-559 2001.

Mosendz et al., "Spin dynamics at low microwave frequencies in crystalline Fe ultrathin film double layers using co-planar transmission lines," *J. Magn. Magn. Mater.*, 300:174, 2006.

Oh et al., "Evidence of electron-spin wave coupling in $Co_xNb_y$ magnetic metal thin film," *J. Magn. Magn. Mater.*, 293:880, 2005.

Polder, "On the theory of ferromagnetic resonance, Chapter VIII," *Philosophical Magazine*, 40:99-115, 1949.

Puszkarski, "Theory of syrface states in spin wave resonance," *Prog. Surf. Sci.*, 9:191-247, 1979.

Saitoh et al., "Conversion of spin current into charge current at room temperature: inverse spin-Hall effect," *Appl. Phys. Lett.*, 88:182509, 2006.

Sankey et al., "Spin-transfer-driven ferromagnetic resonance of individual nanomagnets," *Phys. Rev. Lett.*, 96:227601, 2006.

Slonczewski, "Current-driven excitation of magnetic multilayers," *J. Magn. Magn. Mater.*, 159:L1, 1996.

Sodha and Srivasta, *Microwave Propagation in Ferrimagnets*, Plenum Press, New York, 1981.

Tserkovnyak et al., "Nonlocal magnetization dynamics in ferromagnetic heterostructures," *Rev. Mod. Phys.*, 77:1375-1421, 2005.

Tulapurkar et al., "Spin-torque diode effect in magnetic tunnel junctions," *Nature*, 438:339-42, 2005.

Vonsovskii, *Ferromagnetic Resonances: the phenomenon of resonant absorption of a high-frequency magnetic field in ferromagnetic substances*, (Pergamon, New York) 38-39, 1966.

Wang et al., "Voltage generation by ferromagnetic resonance at a nonmagnet to ferromagnet contact," *Phys. Rev. Lett.*, 97:216602, 2006.

Wen, "Coplanar waveguide: a surface strip transmission line suitable for nonreciprocal gyromagnetic device application," *IEEE Trans. Microwave Theory Tech.*, 17:1087, 1969.

Wirthmann et al., "Broadband electrical detection of spin excitation in $Ga0.98Mn0.02As$ using a photovoltage technique," *Applied Physics Letters*, 92:232106, 2008.

(56) References Cited

OTHER PUBLICATIONS

Yamaguchi et al., "Rectification of radio frequency current in ferromagnetic nanowire," *Appl. Phys. Lett.*, 90:182507, 2007.
Yamaguchi et al., "Self-homodyne rf demodulator using a ferromagnetic nanowire," *Appl. Phys. Lett.*, 90:212505, 2007.
Yang et al., "Spectral dependence of spin photocurrent and current-induced spin polorization in an InGaAs / InAlAs two-dimensional electron gas," *Phys. Rev. Lett.*, 96:186605, 2006.
Yau and Chang, "The planar Hall effect in thin foils of Ni-Fe alloy," *J. Phys. F.*, 1:38, 1971.
Zhu and Zheng, "The micromagnetics of magnetoresistive random access memory," *In:* Spin Dynamics in Confined Magnetic Structures I, Springer, Berlin, 289-323, 2002.
Zhu et al., "Near field microwave phase imaging by a spintronic sensor," *Seventh International Conference on Thin Film Physics and Applications*, 7995:79951X-79951X-6, 2010.

* cited by examiner

Ferromagnet, e.g. Permalloy, GaMnAs or Iron, ...
Electrical insulator e.g. SiO$_2$
Electrical conductor, e.g. Cu
Electrically insulating substrate: Silicon, GaAs, Glass, Plastic, ...

SPINTRONIC PHASE COMPARATOR PERMITTING DIRECT PHASE PROBING AND MAPPING OF ELECTROMAGNETIC SIGNALS

CROSS-REFERENCE TO RELATED APPLICATIONS

This application claims priority to U.S. Provisional Application No. 61/360,479 filed Jun. 30, 2010, the entire disclosure of which is specifically incorporated by reference herein without disclaimer.

BACKGROUND OF THE INVENTION

1. Field of the Invention

This invention relates to microwave spintronics and more particularly relates to an apparatus, system, and method for direct phase probing and mapping via spintronic Michelson inferometry.

2. Description of the Related Art

Microwave propagation in a dielectric medium underlies all responses of microwave energy interaction with the dielectric system. Therefore, it is generally accepted that the dielectric properties can be accurately reconstructed by characterizing the spatial distribution of absorbed microwave energy. Because the dielectric properties of the human body have significant differences between unhealthy and healthy tissues at microwave frequencies, microwaves are believed to have the capability for medical imaging and the pioneering works appear as early as 1986. Although much progress has been achieved in the past decade, microwaves are still considered to be a "potentially" powerful tool for medical imaging and far from clinical applications. One bottleneck here concerns the size of the detected object, since a curable tumor should have a size of a few millimeters, i.e., far shorter than the microwave wavelength (typical in a few 1 to 10 centimeters). Physically, such subwavelength features carried by the microwave field patterns contain spatial Fourier components with transverse propagation vectors $k_{xy}$, larger than the wave vector $k=\omega\sqrt{\in\mu}$ in the media. This information may evanescently decays along z due to the imaginary number of $k_z=\sqrt{k^2-k_{xy}^2}$ and therefore is restricted to the near-field.

Another problem of microwave imaging relates to transmission line based approaches, where the sensitivity is limited by the background signal that comes from the transmission lines themselves. This parasitic noise significantly decreases the resolution of measurements. In addition, the antennas used in traditional microwave imaging, include a large amount of metallic materials, which may significantly distort the microwave propagation. Therefore a better data acquisition system with high sensitivity and an antenna compensation in the reconstruction algorithm is needed, which increases the burden of computation.

Spintronics, as a new discipline, has received much attention recently in an effort to upgrade electronic devices based on transport phenomena. From the dynamic point of view, spin dynamics have a much lower characteristic energy ($\mu$eV) in comparison with charge dynamics (meV-eV). Hence, spintronic devices may be applied for microwave applications. In contrast, conventional charge-dynamics-based electronics fit only to the infrared-optical regime. Advancement in microspintronics raises an intriguing question of whether a spintronic approach might transform microwave technologies, in a way similar to the case that microelectronics has revolutionized optical technologies.

As a cornerstone of coherent optics and spectroscopy, Michelson Interferometry as shown in FIG. 1(a) was developed from the ingenious Michelson-Morley experiment, where a sinusodial optical intensity $I(\Psi)=|e_1+e_2e^{i\Psi}|^2=|e_1|^2+|e_2|^2+2|e_1 \cdot e_2|\cos\Psi$ was measured by modulating the electromagnetic phase $\Psi$. This enables probing $\Psi$ which characterizes the phase of both the dynamic electric (e) and magnetic (h) fields.

SUMMARY OF THE INVENTION

A spintronic approach is introduced to transform classic Michelson interferometry that probes electromagnetic phase only. This method utilizes a nonlinear four-wave coherent mixing effect. A previously unknown striking relation between spin dynamics and the relative phase of electromagnetic waves is revealed. Spintronic Michelson interferometry allows direct probing of both the spin resonance phase and the relative phase of electromagnetic waves via microspintronics. Thereby, it breaks new ground for cross-disciplinary applications with unprecedented capabilities, which have been demonstrated via a powerful phase-resolved spin resonance spectroscopy on magnetic materials and an on-chip technique for phase-resolved near-field microwave imaging.

A spintronic sensor is introduced to achieve a phase- and amplitude-resolved near-field dielectric image without using any complex reconstruction algorithms. This imaging technique employs the interference principle of microwave fields by the spin rectification effect, in which the relative phase of the coupled microwave fields is effectively controlled to perform a direct detection of both the amplitude and the phase of the microwave field in a subwavelength scale. These microwave field patterns with subwavelength features show a strong dependence on the dielectric constant of materials in the vicinity, and agree well with simulation results by COMSOL.

One embodiment of an apparatus is described. The apparatus may include a magnetic element, one or more first signal contacts coupled to the magnetic element for receiving a first signal, and one or more output contacts coupled to the magnetic element for providing a variable level voltage generated by the magnetic element, the level of the voltage being responsive to a phase difference between the first signal and a second signal. In a further embodiment, the apparatus may include a substrate for mechanically supporting the magnetic element. Additionally, the apparatus may include a conductor mechanically supported by substrate, the conductor configured to receive the second signal.

In a particular embodiment, the apparatus may include an electrical insulator positioned to separate the conductor from the magnetic element. The electrical insulator may be configured to electrically insulate the magnetic element from the conductor.

In a further embodiment, the apparatus may include one or more second signal contacts coupled to the conductor, the second signal contacts configured to receive the second signal.

In particular embodiments, the electrical conductor may be copper. Alternatives may include gold, aluminum, or other electrical conductors. The electrically insulating substrate may include Silicon. Alternatives may include Quartz, glass, Gallium, or the like. The electrical insulator may include silicon dioxide (SiO2). Alternative insulators may include air, oil, Silicon Nitride, or the like.

In a particular embodiment, the magnetic element has an anisotropic magnetoresistance. For example, the magnetic element may include a ferromagnet. In a particular embodiment, the magnetic element may be a permalloy material. In another embodiment, the magnetic element may comprise a ferromagnetic semiconductor material, such as GaMnAS. In still another embodiment, the magnetic element may include an electrically conductive material, such as iron.

In these various embodiments, the first signal and the second signal may be electromagnetic signals having a frequency in the range of 0.1 GHz to 200 GHz. The strength of external magnetic field produced by the external magnetic field source may change the frequency range in which the apparatus responds. For example, the range may include 0.1 GHz to 20 GHz, 0.1 GHz to 25 GHz, 0.1 GHz to 30 GHz, 0.1 GHz to 40 GHz, 0.1 GHz to 50 GHz, 0.1 GHz to 75 GHz, 0.1 GHz to 100 GHz, 0.1 GHz to 150 GHz, or 0.1 GHz to 200 GHz, depending on strength of magnetic element.

A system is also described. In one embodiment, the system includes a first signal source configured to provide a first signal and a second signal source configured to provide a second signal. The system may also include a phase comparator device. The phase comparator device may include a magnetic element, one or more first signal contacts, coupled to the magnetic element, for receiving a first signal, and one or more output contacts, coupled to the magnetic element, for providing a variable level voltage generated by the magnetic element, the level of the voltage being responsive to a phase difference between the first signal and a second signal. In a further embodiment, the system may include a meter coupled to the spintronic phase comparator configured to measure the voltage generated by the magnetic element.

The phase comparator device may also include a conductor mechanically supported by a substrate, the conductor configured to receive the second signal. In a particular embodiment, the phase comparator device also includes an electrical insulator positioned to separate the conductor from the magnetic element. The electrical insulator may electrically insulate the magnetic element from the conductor. Additionally, the phase comparator device may include one or more second signal contacts coupled to the conductor, the second signal contacts configured to receive the second signal.

In one embodiment, the system may include a signal generator for providing the first signal. For example the first signal may be a reference signal provided by a reference signal generator configured to generate a relatively constant frequency electromagnetic signal.

In particular applications, the second signal may be electromagnetic radiation reflected by an object in the near field. For example, the system may be used for medical imaging, where the object is a tumor, a body organ, or another anatomical feature of a body. Alternatively, the second signal may be electromagnetic radiation reflected by an object in the far field.

In one embodiment, the system may also include a processing device configured to determine a dielectric function of an object in response to a phase difference between the first signal and the second signal, where the second signal comprises electromagnetic radiation reflected by the object. For example, the processing device may be a computer, a microprocessor, a programmable logic device, or the like. Additionally, the processing device may determine a homogeneity or inhomogeneity of an object in response to a phase difference between the first signal and the second signal, where the second signal comprises electromagnetic radiation reflected by the object. Indeed, the processing device may compute a variety of feature in response to the phase comparison information.

A method for phase comparison of electromagnetic signals is also described. In one embodiment, the method include receiving a first signal from a first signal source at a magnetic element, receiving a second signal from a second signal source, and generating, with the magnetic element, a variable level voltage, the level of the voltage being responsive to a phase difference between the first signal and a second signal.

The method may also include measuring the voltage generated by the magnetic element. In still a further embodiment the method may include quantifying a phase difference between the first signal and the second signal in response to the voltage generated by the magnetic element. In certain embodiments, the method may include generating the first signal with a first signal source. In a particular embodiment, the second signal comprises electromagnetic radiation reflected by an object in the near field. Alternatively, the second signal may include electromagnetic radiation reflected by an object in the far field.

A method for manufacturing a phase comparator device is also described. In one embodiment, the method includes providing a substrate, providing a magnetic element coupled to the substrate, forming one or more first signal contacts, coupled to the magnetic element, for receiving a first signal, and forming one or more output contacts, coupled to the magnetic element, for providing a variable level voltage, the level of the voltage being responsive to a phase difference between the first signal and a second signal.

The method may also include providing a conductor coupled to the electrically insulating substrate, the conductor configured to receive the second signal. In a further embodiment, the method includes forming an electrical insulator positioned to separate the conductor from the magnetic element. Also, the method may include forming one or more second signal contacts coupled to the conductor, the second signal contacts configured to receive the second signal.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Figure 1:
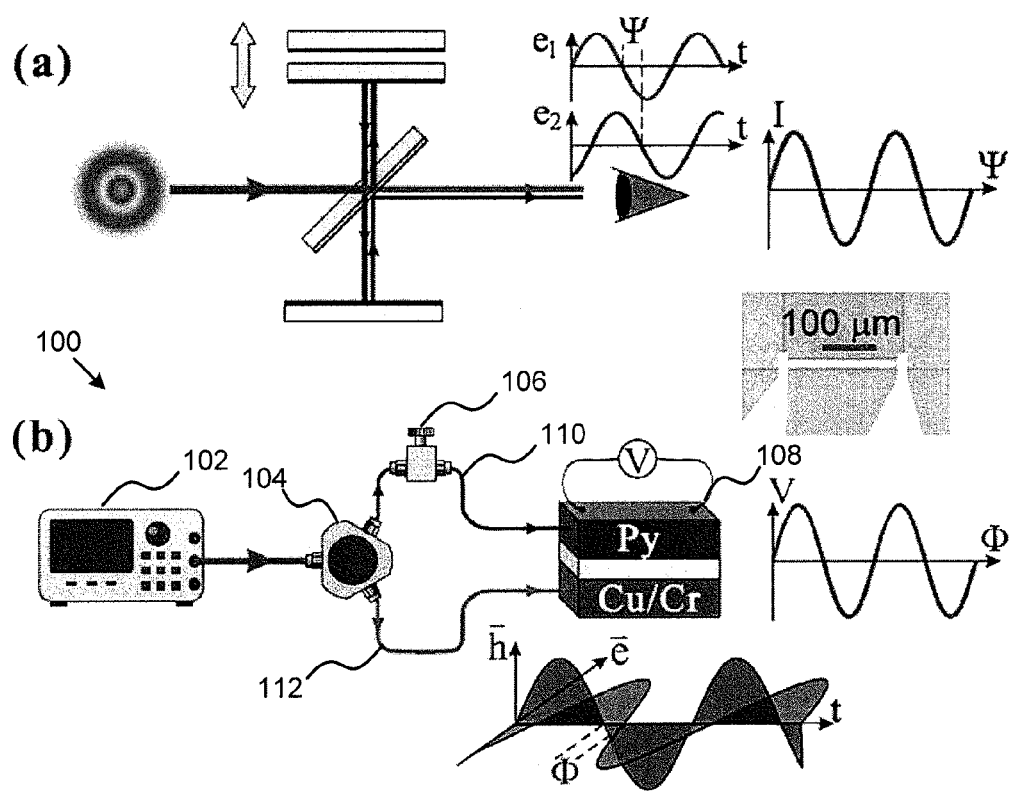
FIG. 1 is a schematic block diagram illustrating (a) Michelson interferometry that measures a sinusoidal optical intensity I induced by the modulation of the electromagnetic phase; and (b) Spintronic Michelson interferometry that measures a sinusoidal electrical signal V caused by the modulation of the relative electromagnetic phase $\Phi$. Inset shows a top view micrograph of the microspintronic detector.

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Standard Michelson interferometry does not utilize the full coherence of the electromagnetic dynamics, since it does not probe the phase difference between e and h fields. Such a relative electromagnetic phase $\Phi$ has broad physical relevance. From the perspective of materials science, considering the simplest case of a plane wave propagating in a uniform medium, $\Phi$ varies from 0 in a low conductive material to $\pi/4$ in a perfect conductor. It measures, in the general context, the ratio between propagative and dissipative wave characteristics, i.e., the wave impedance which is determined by basic material properties. As a different basic example from the perspective of wave physics, $\Phi$ of the radiated electromagnetic wave emitted by an elemental dipole antenna varies from $\pi/2$ in the near-field region to 0 in the far-field region. Here, it characterizes the ratio between evanescent and propagative wave components.

In fact, $\Phi$ reveals the fundamental coherence between electrical and magnetic dynamics which has relevance in quantum optics. At the classical level, however, such a fundamental coherence has been barely utilized because directly probing $\Phi$ requires coherent detection of both e and h fields simultaneously, which cannot be achieved by any conventional technique. In the present embodiments, however, a microspintronic device is used to establish spintronic Michelson interferometry, which enables probing $\Phi$ directly via a sinusoidal electrical signal $V(\Phi)$, as illustrated in FIG. 1(b).

FIG. 1(b) illustrates a system 100 for phase detection of electromagnetic signals. In one embodiment, the system 100 includes a first signal source 110 configured to provide a first signal and a second signal source 112 configured to provide a second signal. The system 100 may also include a phase comparator device 108. The phase comparator device 108 may include a magnetic element 204, one or more first signal contacts 206, coupled to the magnetic element 204, for receiving a first signal, and one or more output contacts 206, coupled to the magnetic element 204, for providing a variable level voltage generated by the magnetic element 204, the level of the voltage being responsive to a phase difference between the first signal and a second signal. In a further embodiment, the system 100 may include a meter coupled to the spintronic phase comparator configured to measure the voltage generated by the magnetic element 204.

The phase comparator device 108 may also include a conductor 210 mechanically supported by a substrate 202, the conductor 210 configured to receive the second signal. In a particular embodiment, the phase comparator device also includes an electrical insulator positioned to separate the conductor 210 from the magnetic element 204. The electrical insulator may electrically insulate the magnetic element 204 from the conductor 210. Additionally, the phase comparator device may include one or more second signal contacts 214 coupled to the conductor 210, the second signal contacts 214 configured to receive the second signal.

In one embodiment, the system 100 may include a signal generator 102 for providing the first signal. For example the first signal may be a reference signal provided by a reference signal generator 102 configured to generate a relatively constant frequency electromagnetic signal.

In particular applications, the second signal may be electromagnetic radiation reflected by an object in the near field. For example, the system 100 may be used for medical imaging, where the object is a tumor, a body organ, or another anatomical feature of a body. Alternatively, the second signal may be electromagnetic radiation reflected by an object in the far field.

In one embodiment, the system 100 may also include a processing device configured to determine a dielectric function of an object in response to a phase difference between the first signal and the second signal, where the second signal comprises electromagnetic radiation reflected by the object. For example, the processing device may be a computer, a microprocessor, a programmable logic device, or the like. Additionally, the processing device may determine a homogeneity or inhomogeneity of an object in response to a phase difference between the first signal and the second signal, where the second signal comprises electromagnetic radiation reflected by the object. Indeed, the processing device may compute a variety of feature in response to the phase comparison information.

The primary setup as shown in FIG. 1(b) involves a microwave generator, from which the high-frequency electromagnetic wave (0.1 to 20 GHz) is directed via a coaxial cable to a RF power divider, which coherently splits the microwave into two different paths leading to two different parts of a hybrid spintronic detector. The detector consists of a metallic bilayer of Cu/Cr (200/10 nm) and a ferromagnetic thin layer of $Ni_{80}Fe_{20}$ (permalloy, Py) (100 nm). They are electrically separated by a 200 nm thick isolating $SiO_2$ layer. Such hybrid multilayers are deposited on a semi-insulating GaAs substrate, and are fabricated into a microstrip with a lateral dimension of 5 μm×300 μm (see the inset of FIG. 1). At both ends of the microstrip, ohmic contacts are made separately to the ferromagnetic thin layer and metallic multilayer, which allows them to be connected to the different microwave paths via coaxial cables. A RF phase shifter, which plays the role of the moving mirror in Michelson interferometry, is inserted in one of the paths to control the phase difference between the high-frequency currents/flowing in the two paths.

Figure 2:
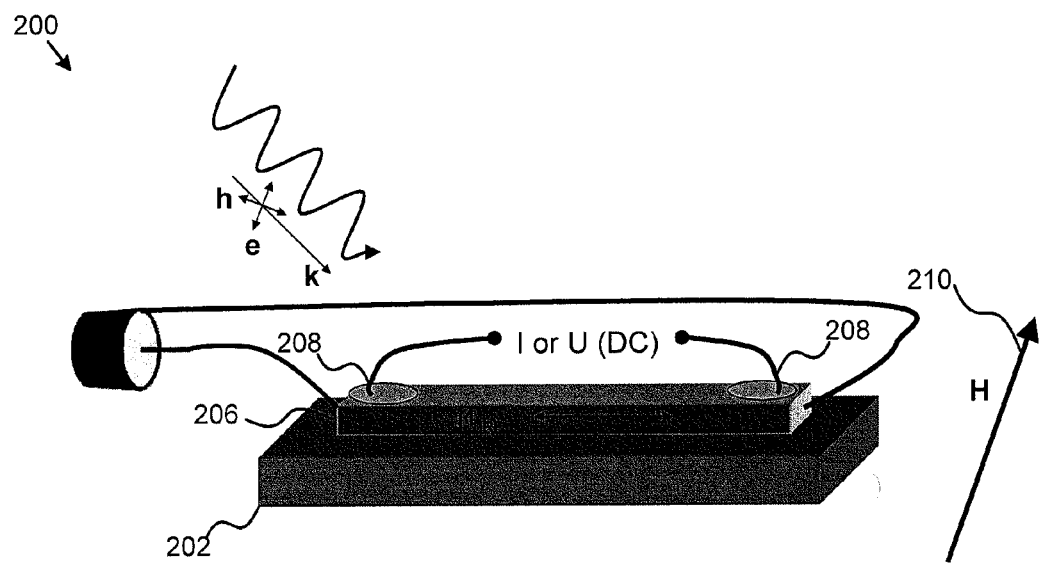
FIG. 2 illustrates one embodiment of a phase comparator device according to the present embodiments.

FIG. 2 illustrates one embodiment of phase comparator device 108 or apparatus. The phase comparator 108 may include a magnetic element 204, one or more first signal contacts 206 coupled to the magnetic element 204 for receiving a first signal, and one or more output contacts 206 coupled to the magnetic element 204 for providing a variable level voltage generated by the magnetic element 204, the level of the voltage being responsive to a phase difference between the first signal and a second signal. In a further embodiment, the apparatus may include a substrate 202 for mechanically supporting the magnetic element 204.

Figure 3:
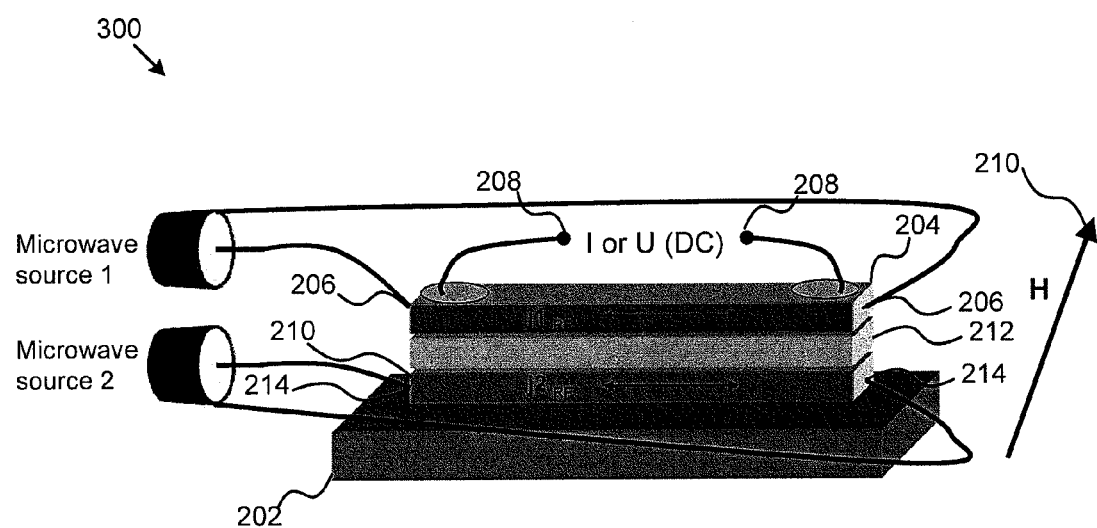
FIG. 3 illustrates another embodiment of a phase comparator device.
Figure 3:

Additionally, as illustrated in FIG. 3, the apparatus may include a conductor 210 mechanically supported by substrate 202, a conductor 210 configured to receive the second signal.

In a particular embodiment, the apparatus may include an electrical insulator positioned to separate the conductor 210 from the magnetic element 204. The electrical insulator may be configured to electrically insulate the magnetic element 204 from the conductor 210.

In a further embodiment, the apparatus may include one or more second signal contacts 214 coupled to the conductor 210, the second signal contacts 214 configured to receive the second signal.

In particular embodiments, the electrical conductor 210 may be copper. Alternatives may include gold, aluminum, or other electrical conductors 210. The electrically insulating substrate 202 may include Silicon. Alternatives may include Quartz, glass, Gallium, or the like. The electrical insulator may include silicon dioxide ($SiO_2$). Alternative insulators may include air, oil, Silicon Nitride, or the like.

In a particular embodiment, the magnetic element 204 has an anisotropic magnetoresistance. For example, the magnetic element 204 may include a ferromagnet. In a particular embodiment, the magnetic element 204 may be a permalloy material. In another embodiment, the magnetic element 204 may comprise a ferromagnetic semiconductor material, such as GaMnAS. In still another embodiment, the magnetic element 204 may include an electrically conductive material, such as iron.

In these various embodiments, the first signal and the second signal may be electromagnetic signals having a frequency in the range of 0.1 GHz to 200 GHz. Strength of magnetic field of the magnetic element 204 may change the frequency range in which the apparatus responds. For example, the range may include 0.1 GHz to 20 GHz, 0.1 GHz to 25 GHz, 0.1 GHz to 30 GHz, 0.1 GHz to 40 GHz, 0.1 GHz to 50 GHz, 0.1 GHz to 75 GHz, 0.1 GHz to 100 GHz, 0.1 GHz to 150 GHz, or 0.1 GHz to 200 GHz, depending on strength of magnetic element 204.

Such a spintronic Michelson interferometer enables unprecedented phase probing capabilities. Note that microwave fields in the ferromagnetic (Py) and metallic layers are mutually coupled and secondary fields are induced, so that four waves exist in the Py layer. Without losing generality, two of the waves induced by $j_1$ flowing in the Py layer via the 1st path are described by $\tilde{e}_{\tilde{1}}=e_1 e^{i(\omega t+\tilde{\Phi})}$ and $\tilde{h}_{\tilde{1}}=h_1 e^{i(\omega t+\Phi+\Phi_1)}$, as determined by Ohm's law and Biot-Savart law, respectively. Here $\Phi$ and $\Phi_1$ are due to the RF phase shifter and the detector impedance for $j_1$, respectively. Similarly, two other waves are induced by $j_2$ flowing in the metallic layer, with $\tilde{e}_{\tilde{2}}=e_2 e^{i\omega t}$ and $\tilde{h}_{\tilde{2}}=h_2 e^{i(\omega t+\Phi_2)}$, where $\Phi_2$ is due to the phase of the impedance for $j_2$ These waves are mixed in the Py layer via the nonlinear spin-rectification effect. Such a nonlinear effect converts microwaves to a dc electrical voltage, which is determined by $V(\Phi)=(S/T)\int_0^T Re\ [\tilde{e}_{\tilde{1}}+\tilde{e}_{\tilde{2}}]\cdot Re[i\tilde{X}\cdot(\tilde{h}_{\tilde{1}}+\tilde{h}_{\tilde{2}})]dt$, where $T=2\pi/\omega$ is the period of the microwave, S is a sensitivity parameter related to the anisotropic magnetoresistance of the Py microstrip and $i\tilde{\chi}$ is the off-diagonal matrix element of the susceptibility tensor. Using the complex form of $\tilde{\chi}=\chi e^{i\Phi}$ with the magnitude $\chi=|\tilde{\chi}|$ and the spin resonance phase $\Theta=\arctan\{Im[\tilde{\chi}]/Re[\tilde{\chi}]\}$, yields the result $$V(\Phi)=V_0+V_+ \sin(\Phi-\Theta-101_2)+V_- \sin(\Phi+\Theta+\Phi_2), \quad (1)$$

where
$V_+=S\chi e_1 h_2/2$, $V_-=-S\chi e_2 h_1/2$, and $V_0=-S\chi\cdot[e_1 h_1 \sin(\Phi_1+\Theta)+e_2 h_2 \sin(\Phi_2+\Theta)]/2$.

Eq. (1) shows that the voltage signal of the spintronic Michelson interferometer is a sinusoidal function of $\Phi$ with an initial phase shift, which is superimposed on a background $V_0$. To highlight more clearly the transforming capabilities of spintronic Michelson interferometry, it is possible to take the example of a special case of $h_1=e_2=0$ by neglecting the secondary h- and e-fields in the Py layer, and it is possible to further initialize $\Phi$ of the phase shifter to include the relative phase $\Phi_2$. Eq. (1) is then reduced to $$V(\Phi)=V_+\sin(\Phi-\Theta), \quad (2)$$

which reveals strikingly a new relation between the phase of spin dynamics ($\Theta$) and the relative phase of microwaves ($\Phi$). Such a new physical insight implies that both $\Phi$ and $\Theta$ can be directly probed by keeping one of them constant. Spintronic Michelson interferometry, therefore, transforms classical Michelson interferometry which only measures $\Psi$.

Figure 4:
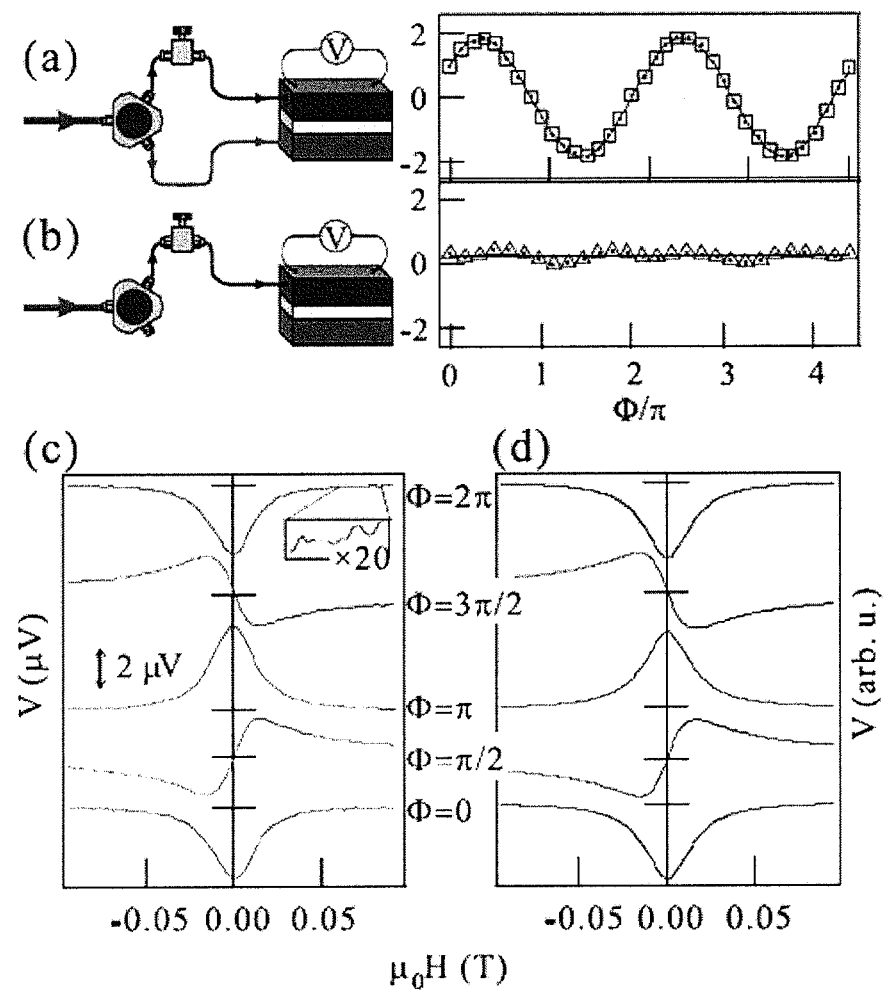
FIG. 4 is a graphical representation of the voltage signal measured by modulating the RF phase shifter with the detector connected to (a) both microwave paths, (b) only one microwave path. (c) FMR spectra measured at 7 GHz and at different $\Phi$. (d) Calculated FMR spectra by using Eq. (2). Note the line shape changes its symmetry and polarity in $\pi/2$ and $\pi$ cycles of $\Phi$, respectively.

In one embodiment, the detector may be set in a fixed external static magnetic field $H_0$ applied nearly perpendicular to the Py layer, which enables spin precession via the ferromagnetic resonance (FMR) with a constant $\Theta$. FIG. 4(a) shows the voltage measured at $\omega/2\pi=4.25$ GHz and $\mu_0 H_0=1.15$ T by modulating $\Phi$, where $\mu_0$ is the permeability of vacuum. A pronounced sinusoidal oscillation is observed as predicted by Eq. (2). For comparison, the signals have been measured by disconnecting one of the microwave paths, leaving the phase shifter to control only the electromagnetic phase $\Psi$ of the microwave sent to the detector. The striking oscillations nearly disappear [FIG. 4(b)], leaving only a background voltage. This confirms that the spintronic Michelson interferometer indeed detects $\Phi$ instead of $\Psi$.

Figure 5:
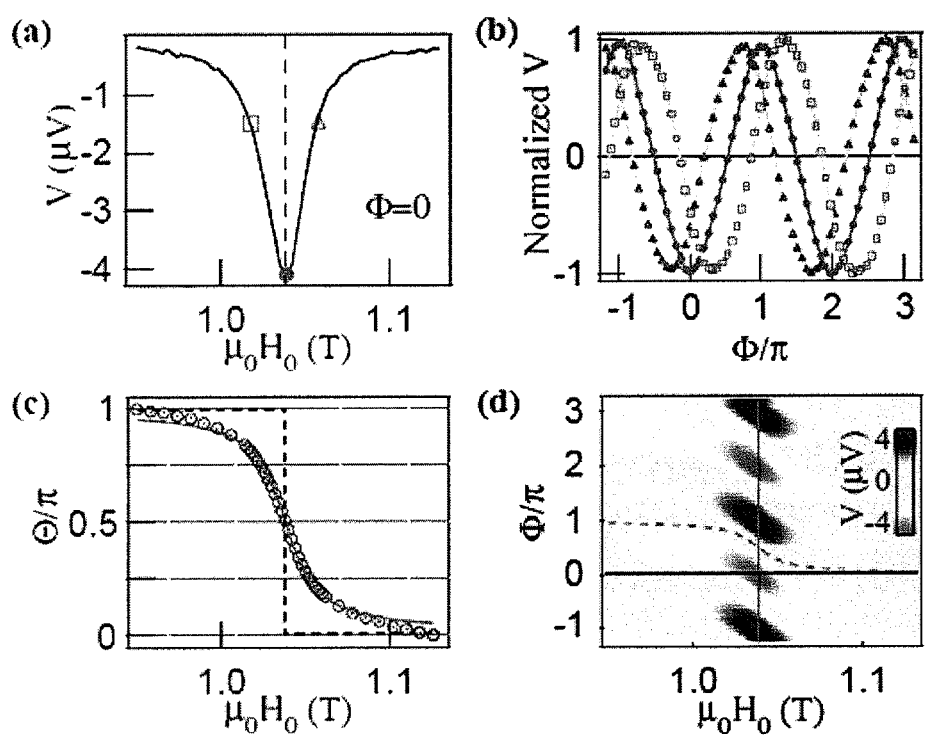
FIG. 5 is a graphical representation of (a) FMR amplitude spectrum measured at 7 GHz and $\Phi=0$. (b) Sinusoidal oscillations of V which show a field dependent phase shift due to the FMR. (c) Directly measured (marks) and fitted (solid curve) FMR phase spectrum at 7 GHz. (d) Phase-amplitude map of FMR measured by the phase-resolved spin resonance spectroscopy, where curves of (a)-(c) can be obtained via the guiding lines.

As the further confirmation, $\Phi$ may be kept constant but sweep the magnetic field $H_0$. This changes the spin resonance phase $\Theta$. Note however, $\Theta$ does not follow $H_0$ linearly, since at a given magnetic field $H_0$ and microwave frequency $\omega$, $\Theta$ describes the phase lag between spin precession and the driving dynamic magnetic field. In general, any ideal resonance without damping induces a phase jump of $\Delta\Theta=\pi$ at resonance frequency, where the response changes from in-phase with the driving field at low frequencies (static), to out-of-phase at high frequencies (dynamic). In case of FMR without damping, by defining $H=H_0-H_R$ as the applied field measured with respect to the resonant field HR, $\Theta(H)=\pi[1-\theta(H)]$ as shown by the dashed line in FIG. 5(c). Here $\theta(H)$ is the unit step function. With damping, such a phase jump occurs smoothly over a broadened resonance, which retains an inherent asymmetry with $\Theta(H)=\pi-\Theta(-H)$. It follows that $\Theta(0)=\pi/2$ at resonance. Since the magnitudes of the matrix elements of the susceptibility tensor are nearly symmetric around the resonance, i.e., $\chi(H)\approx\chi(-H)$, Eq. (2) retains the following symmetries:

$$V(H,\Phi)=V(-H,\Phi), \text{for } \Phi=n\pi;$$

$$V(H,\Phi)=-V(-H,\Phi), \text{for } \Phi=(n+1/2)\pi; \quad (3)$$

$$V(H,\Phi)=-V(-H,\Phi+\pi),$$

where n is any integer number.

FIG. 4(c) shows the signal V(H, $\Phi$) measured at $\omega/2\pi=7$ GHz while setting the phase shifter to $\Phi=0, \pi/2, \pi, 3\pi/2,$ and $2\pi$. The independent signal shows resonances whose line shape changes its symmetry and polarity in $\pi/2$ and $\pi$ cycles of $\Phi$, respectively, as predicted by Eq. (3). This confirms that spintronic Michelson interferometry enables probing $\Theta$, in addition to $\Phi$.

Thus, the principle for electrically probing both $\Theta$ and $\Phi$ via spintronic Michelson interferometry is established, which enables utilizing the full coherence of both spin and electromagnetic dynamics. In the following it has been demonstrated that the unprecedented capabilities of spintronic Michelson interferometry through distinct examples from two different disciplines. They establish the phase-resolved spin resonance spectroscopy (FIG. 5) and phase-resolved near-field microwave imaging (FIG. 6), which have materials science and wave physics relevance, respectively.

FIG. 5(a) shows the FMR amplitude spectrum $V(H_0)$ measured at $\omega/2\pi=7$ GHz and $\Phi=0$. At the resonant field of $\mu_0 H_R=1.04$ T, $V(\Phi)$ is measured and plotted in FIG. 5(b) with solid marks, which shows the sinusoidal oscillation as discussed. Also plotted in FIG. 5(b) are two other sinusoidal oscillations measured at $\mu_0 H_0=\mu_0 H_R\pm 0.02$ T as marked in FIG. 5(a). The phase of the oscillations at larger fields may lag behind the phase of the oscillations measured at smaller fields. The directly measured phase spectrum is plotted in FIG. 5(c). Note previously, spin-resonance phase can only be either indirectly probed via the time-resolved magneto-optical Kerr effect, which depends on the complex and controversial magneto-optical relations, or be indirectly calculated from the damping constant. Spintronic Michelson interferometry enables the converse procedure for determining the damping constant by directly measuring the phase spectrum. It is significant for studying magnetic materials, where not only the damping constant may be difficult to measure via FMR spectroscopy, but the damping mechanism itself may also constitute a fundamental problem to understand. To demonstrate this capability, the data shown in FIG. 5(c) is fit with $\Theta(H_0)=\Theta\equiv\arctan\{\text{Im}[\tilde\chi]/\text{Re}[\tilde\chi]\}$, where $\tilde\chi\propto[(H_o-H_R)+i\Delta H]/[(H_0-H_R)^2+\Delta H^2]$ is solved from the Landau-Lifschitz-Gilbert equation for FMR. By recalling that $\Theta(H_0)$ is an asymmetric function centered at resonance with $\Theta(H_R)=\pi/2$, $\Delta H$ may be used as the only fitting parameter. The fit works remarkably well as plotted by the solid curve in FIG. 5(c), whereby $\mu_0\Delta H=0.0134$ T is determined.

Using this damping parameter, V(H, $\Phi$) at $\Phi=0, \pi/2, \pi, 3\pi/2,$ and $2\pi$ are calculated via Eq. (2) and plotted in FIG. 2(d). The excellent agreement between curves plotted in FIGS. 2(c) and 2(d) further verifies that the spin resonant phase is properly determined. In fact, spintronic Michelson interferometry enables the perfect combination of the complimentary phase and amplitude spectroscopy, which can be performed by modulating the phase shifter and sweeping the field (or frequency), respectively. Typical results from such a powerful phase-resolved spin resonance spectroscopy are plotted in FIG. 5(d), where the amplitude spectrum of FIG. 5(a) (following the horizontal line), the $\Phi$-induced oscillation of FIG. 5(b) (vertical line), and the spin-resonance phase spectrum of FIG. 5(c) (dashed curve) can all be determined accordingly. Similar phase-amplitude maps for spin waves are also obtained (not shown) which reveal the full coherence of spin dynamics that is of significance for the emerging discipline of spin wave optics.

Finally, it has been demonstrated that phase-resolved near-field microwave imaging using spintronic Michelson interferometry. The experiment is performed with a slightly modified setup as shown in FIG. 6(a), where a horn antenna is inserted into one of the microwave paths, which imposes a nearly plane wave at $\omega/2\pi=8.3$ GHz (wavelength $\lambda=3.6$ cm) on the adjacent dielectric gratings. The transmitted microwaves are locally detected by the microspintronic detector which is now placed in an in-plane magnetic field of 60 mT, and scans along both the x and z directions. The gratings, with a period of $\lambda/2$, are made of channels with subwavelength dimensions ($\lambda/6$ in the width and $\lambda/9$ in the depth), and are engraved in a microwave transparent slab made of Methyl Methacry-late (PMMA). The channels are filled with a 1:1 mixture of water-isopropylalcohol, which partially absorbs microwaves to induce periodic modulation (along the x-axis) of $\Phi$ of the near-field microwave fields. The phase shifter is initialized by placing the detector at the far-field of z=1.1λ behind a reference PMMA slab without the engraved gratings.

Figure 6:
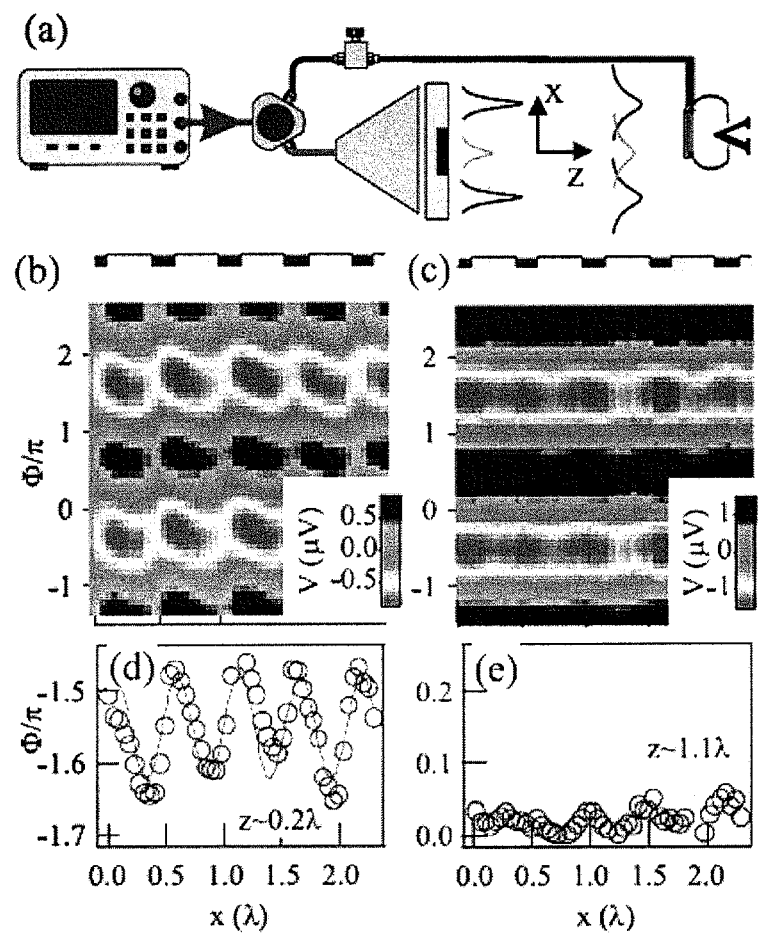
FIG. 6 illustrates (a) Setup for near-field phase imaging of dielectric gratings placed behind a horn antenna. Near-field and far-field phase images obtained by scanning the detector along the x-axis at a distant of (b) $z=\lambda/6$ and (c) $1.1\lambda$, respectively, behind the gratings. Spatial oscillation of the phase determined at (d) $z=\lambda/6$ and (e) $1.1\lambda$.

FIG. 6(*b*) shows the phase- and amplitude-resolved near-field image measured by tuning the phase shifter, and by scanning the detector along the x-axis at z=λ/6 closely behind the gratings. In addition to the expected amplitude modulation due to microwave absorptions in the gratings, a pronounced subwavelength spatial oscillation of the microwave phase is determined as plotted in FIG. 6(*d*). For comparison, a far-field image taken at z=1.1λ is shown in FIG. 6(*c*), where the spatial phase oscillation (FIG. 6(*e*)) is significantly reduced. It demonstrates the capability of spintronic Michelson interferometry for near-field phase imaging. Note despite significant interest in near-field microwave imaging for biological applications, progress has been limited in contrast to optical imaging technologies, mainly due to the lack of matching microelectronics. Such charge-based electronics have revolutionized imaging technologies in the optical regime via local phase-resolved sensing and digital phase modulation techniques. With spintronic Michelson interferometry employing microspintronics, local and electrical phase probing and modulation become feasible in the microwave regime. This breaks new ground for broad applications such as near-field microwave imaging, meta-materials designing, and materials research with spin dynamics relevance.

Figure 7:
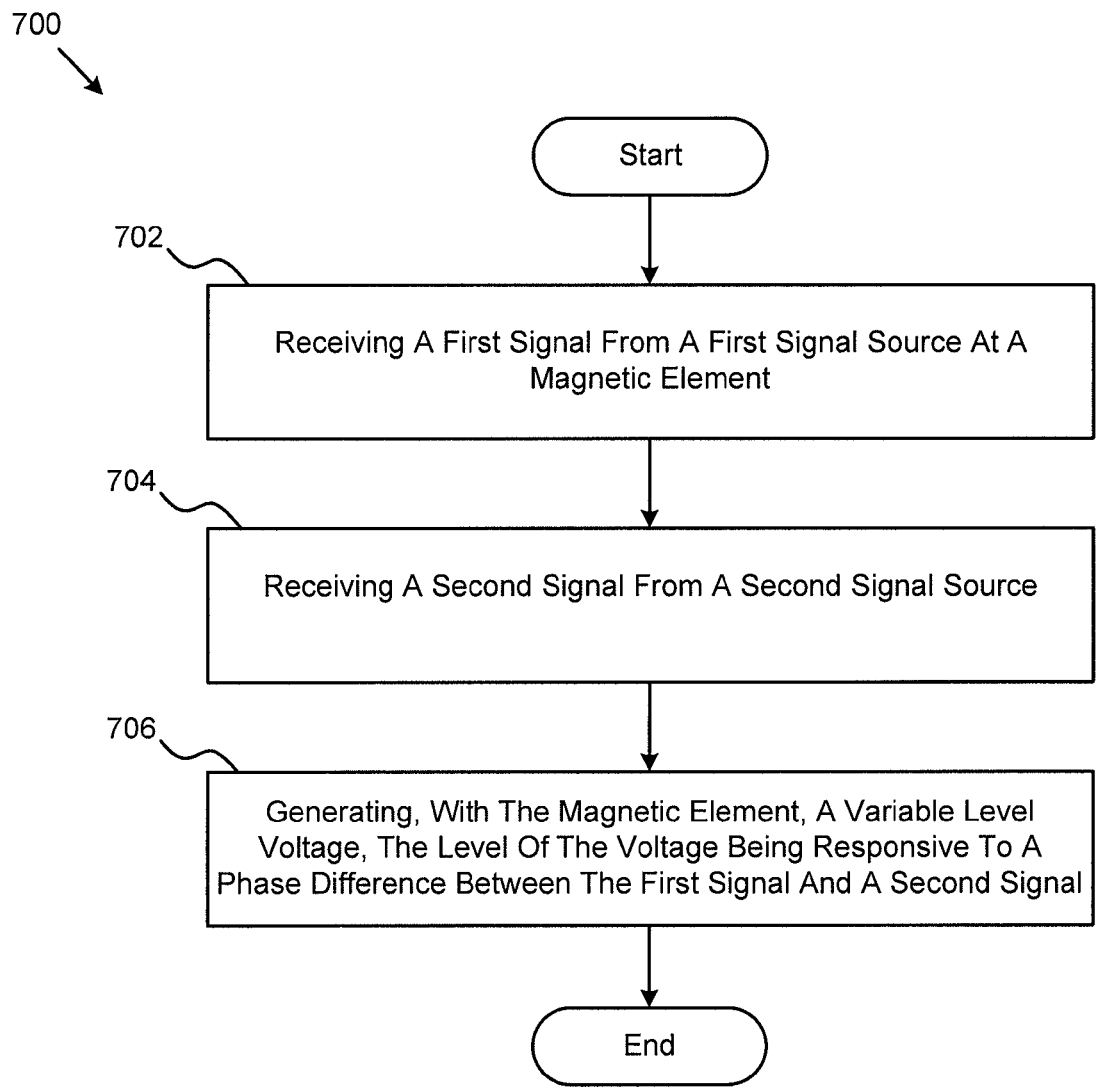
FIG. 7 is a flow-chart diagram illustrating one embodiment of a method for phase comparison of electromagnetic signals.

FIG. 7 illustrates one embodiment of a method 700 for phase comparison of electromagnetic signals is also described. In one embodiment, the method include receiving 702 a first signal from a first signal source at a magnetic element 204, receiving 704 a second signal from a second signal source, and generating 706, with the magnetic element 204, a variable level voltage, the level of the voltage being responsive to a phase difference between the first signal and a second signal.

The method may also include measuring the voltage generated by the magnetic element 204. In still a further embodiment the method may include quantifying a phase difference between the first signal and the second signal in response to the voltage generated by the magnetic element 204. In certain embodiments, the method may include generating 706 the first signal with a first signal source. In a particular embodiment, the second signal comprises electromagnetic radiation reflected by an object in the near field. Alternatively, the second signal may include electromagnetic radiation reflected by an object in the far field.

Figure 8:
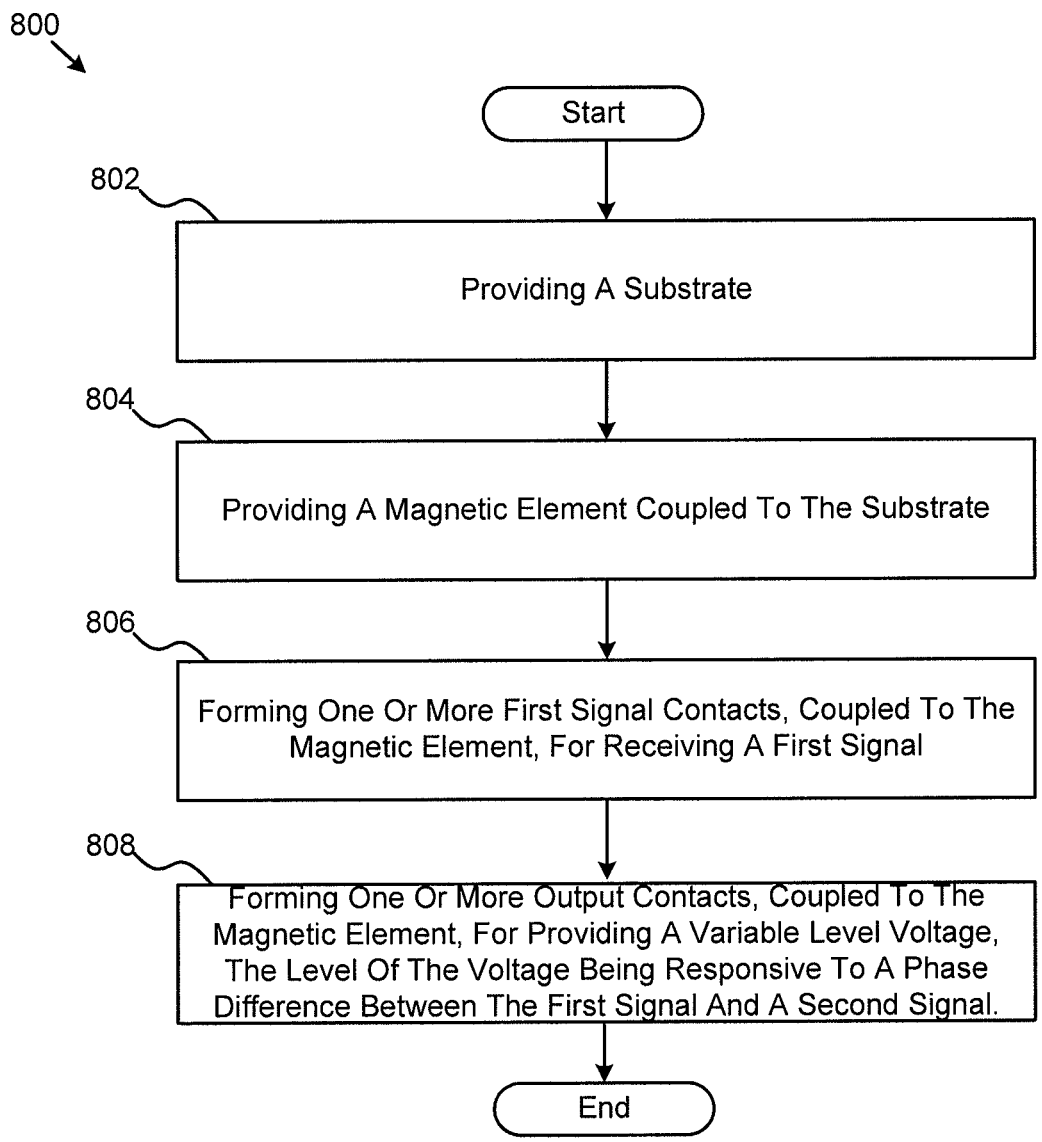
FIG. 8 is a flow-chart diagram illustrating one embodiment of a method for manufacturing a phase comparator device.

A method 800 for manufacturing a phase comparator device is also described in FIG. 8. In one embodiment, the method includes providing 802 a substrate 202, providing 804 a magnetic element 204 coupled to the substrate 202, forming 806 one or more first signal contacts 206, coupled to the magnetic element 204, for receiving 702 a first signal, and forming 808 one or more output contacts 206, coupled to the magnetic element 204, for providing a variable level voltage, the level of the voltage being responsive to a phase difference between the first signal and a second signal.

The method may also include providing a conductor 210 coupled to the electrically insulating substrate 202, the conductor 210 configured to receive the second signal. In a further embodiment, the method includes forming an electrical insulator positioned to separate the conductor 210 from the magnetic element 204. Also, the method may include forming one or more second signal contacts 214 coupled to the conductor 210, the second signal contacts 214 configured to receive the second signal.

The present embodiments also describe an alternative method of dielectric imaging using spintronic Michelson interferometry, where the relative phase of microwave fields can be effectively controlled by a phase shift. This enables a local detection of microwave fields in a subwavelength scale by a spin-dynamo fabricated in a microchip. Continuously turning this relative phase, an interference pattern appears in the photovoltage (PV) signal, and can be used to reconstruct the dielectric constants. The phase and amplitude-resolved image has been obtained for a dielectric grating with subwavelength dimensions, where the engraved channels are filled with water-isopropyl-alcohol mixtures with different composition. Both the amplitude and phase contrast in the image have demonstrated their strong dependence on the dielectric constant, which is in agreement with the simulation of microwave field distribution by COMSOL.

Figure 9:
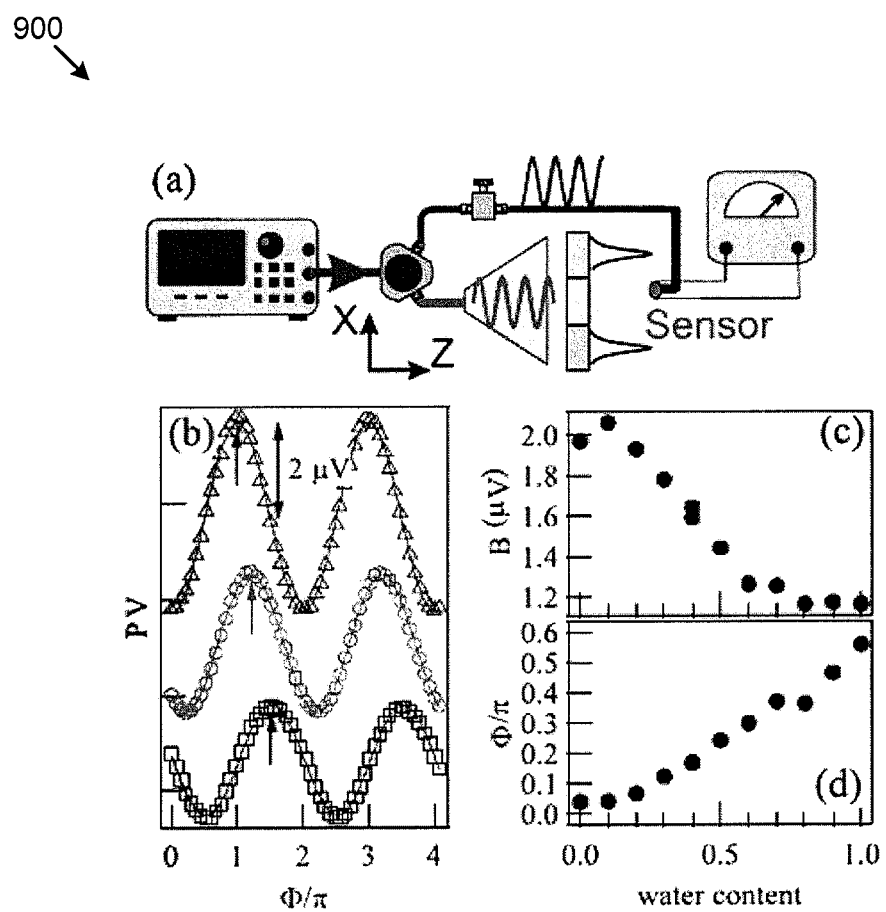
FIG. 9 illustrates (a) one embodiment of schematic experimental setup, where the microwave power is split into two parts, which travel their own paths and are finally coupled at a spintronic sensor. A lock-in pre-amplifier is used to measure the microwave induced voltage signal. (b) The interference patterns for three different liquid: water (squares), 1:1 mixture of water and isopropyl alcohol (circles), and isopropyl alcohol (triangles), which show the phase shift indicated by the arrows. The solid lines are fitting results according to Eq. (1). The depth of water is about 1.6 mm, and the external applied magnetic field is 60 mT. (c) The amplitude of photovoltage and (d) the phase shift with respect to air as a function of water content in water-isopropyl-alcohol mixtures.

The primary setup as shown in FIG. 9(*a*) forms a spintronic Michelson Interferometer. A broadband microwave generator is connected to a power divider, which is used to coherently split microwave into two equal parts for each path: in one path microwaves are directly injected into the sensor from a coaxial cable while in another part microwaves shine on the sensor from a horn antenna. The sensor is a first generation spin dynamo, which can down-convert the high frequency microwave signal to a low frequency PV signal by the spin rectification effect. Such a spin rectification principle enables a very sensitive phase detection of microwave fields. A phase shift situated in one path is used to control the relative phase of microwave fields in the sensor. By turning the phase shift continuously, the PV interference patterns change in both the amplitude and the phase if a dielectric medium is inserted between the horn antenna and the sensor because the wave propagation is modified in this path.

If a dielectric structure with subwavelength features, such as a grating including periodical channels engraved in a slab, is situated between the horn antenna and the spin dynamo, both the amplitude and the phase of transmitted microwaves are locally modulated due to the dielectric contrast. Because of their near-field features, the sensor has to be placed adjacent to the grating in order to detected this local modulation. In this letter, the microwave frequency is set to be $\omega/2\pi$=8.1 GHz with a wavelength of λ=3.7 cm in free space for the near-field experiment. Similar results have been observed for other frequencies. The dielectric grating with a period of λ/5 is made from a slab of microwave transparent Methyl Methacrylate (PMMA, $\in/\in_0$=2.9), where channels of λ/12 in the width and λ/15 in the depth are milled in a milling machine with a resolution of 0.025 mm. The channels are filled with a water-isopropyl-alcohol mixture with different composition in order to form a variable dielectric contrast. This periodical modulation in both the amplitude and the phase of near-field microwave fields can be detected by scanning the grating with respect to a spintronic sensor, which is situated at λ/15 behind the grating.

Without losing generality, it has been shown that such phase and amplitude-resolved experiments for a "bulk" liquid in the far-field range, where the microwaves propagate only along z without another component of k.[1] Here a "bulk" liquid means liquid in a container with dimensions along both x and y larger than the microwave wavelength, in order to compare with the grating structure, where the subwavelength structure is fabricated along x. Turning the phase shift, the PV signal may demonstrate the interference patterns shown in FIG. 9(*b*). The amplitude for water (squares) may be significantly weaker than that for isopropyl alcohol (triangles), which can be explained by a weaker transmission in water. Meanwhile phases of the interference patterns indicated by the arrows are different because of the distinction in the magnitude of ∈.

These interference patterns can be excellently fitted by a sinusoidal function (solid lines) according to:

$$PV(\Phi) = A + B\sin(\Phi - \Phi_0) \qquad (4)$$

where A and B are the background and sinusoidal oscillating PV signal, respectively, determined by the material parameters of the device and the electromagnetic field, $\Phi$ is the phase controlled by the phase shifter, and $\Phi_0$ is the phase difference between the two paths including the phase lag between spin precession and the driving microwave field. In this experiment, the phase lag is a constant because both the magnetic field and microwave frequency are fixed.

A set of water-isopropyl-alcohol mixtures have been measured and fitted by Eq. (4). The extracted amplitude B and $\Phi_0$ are plotted as a function of water content as shown in FIG. 9(c) and (d), respectively. For clarity, $\Phi_0$ is offset with respect to $\Phi_0$ at air, where the container is empty. In contrast to a monotonic increase of phase with water content, the amplitude doesn't show significant change for mixtures of water content from 60% to 100%. Physically, both B and $\Phi_0$ are related to the transmission of microwaves in the media and determined by dielectric properties. Therefore, it is possible to precisely deduce the dielectric constant from the microwave propagation in comparison with the case for air ($\in/\in_0 = 1$). The complex dielectric constants can be deduced to be, for example, $\in/\in_0 = 2.1 - 0.6i$, $\in/\in_0 = 14.5 - 14.4i$, and $\in/\in_0 = 55.4 - 15.2i$ for isopropyl alcohol, 1:1 mixture of water and isopropyl alcohol and water, respectively.

Knowing the principle of phase and amplitude contrasts due to dielectric constants, it is possible to demonstrate the amplitude- and phase-resolved near-field 2D image using a spintronic Michelson interferometer adapting such a principle. FIG. 2(a) shows the near-field image by scanning both the phase shift and the detector situated at $z = 1/15\lambda$ behind the slab. Compared with the PMMA slab, the channels filled with a 1:1 water-isopropyl-alcohol mixture, have less transmission of microwave fields due to both the enhanced reflection and the absorption in the liquid. Therefore, as expected the amplitude of PV extracted from interference patterns displays a periodical modulation shown in FIG. 10(c). A pronounced subwavelength pattern of phase is also found and plotted in FIG. 10(d) (open squares). The spatial resolution in both amplitude and phase diagrams is much shorter than one wavelength, which demonstrates the capability to detect microwave near-field features by adapting the interference principle into a spintronic sensor.

Figure 10:
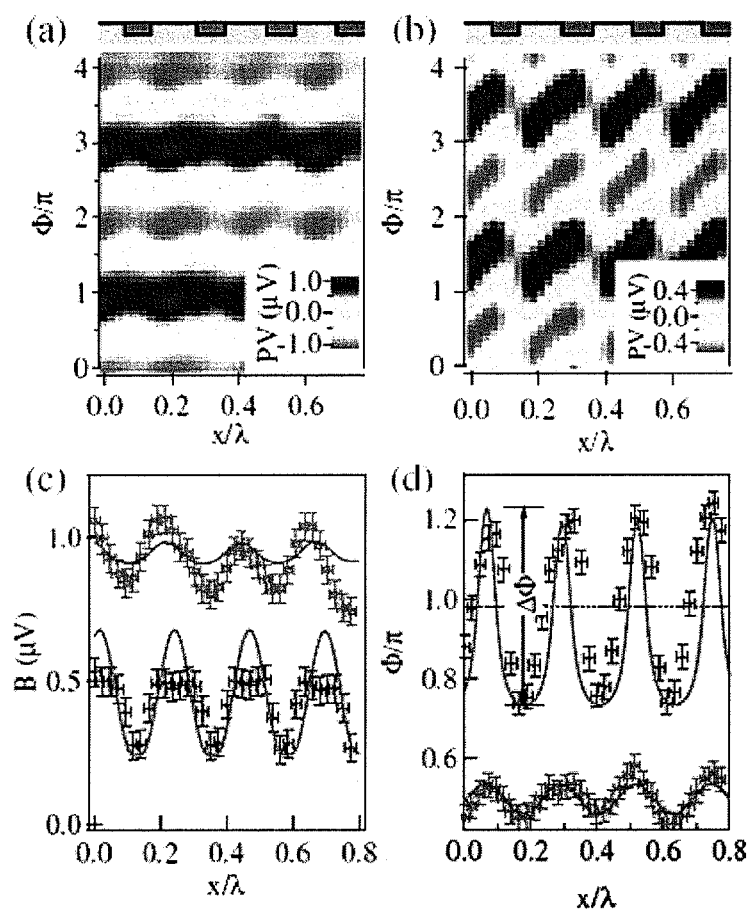
FIG. 10 is a graphical representation of near-field phase mappings obtained by scanning the grating along x with respect to the sensor situated at a distance of $1/15\lambda$ behind the slab. The engraved channels are filled with a 1:1 mixture of water and isopropyl alcohol (a) and water (b). Spatial oscillations of the amplitude (c) and the phase (d) are determined from the interference patterns by using the sinusoidal function of Eq. (1) for each x position. Open squares and open circles represent a 1:1 mixture of water and isopropyl alcohol and water, respectively. The solid curves in (c) and (d) are the simulation results by COMSOL at $z=1.2$ mm, which shows a good agreement with experimental data.
Figure 11:
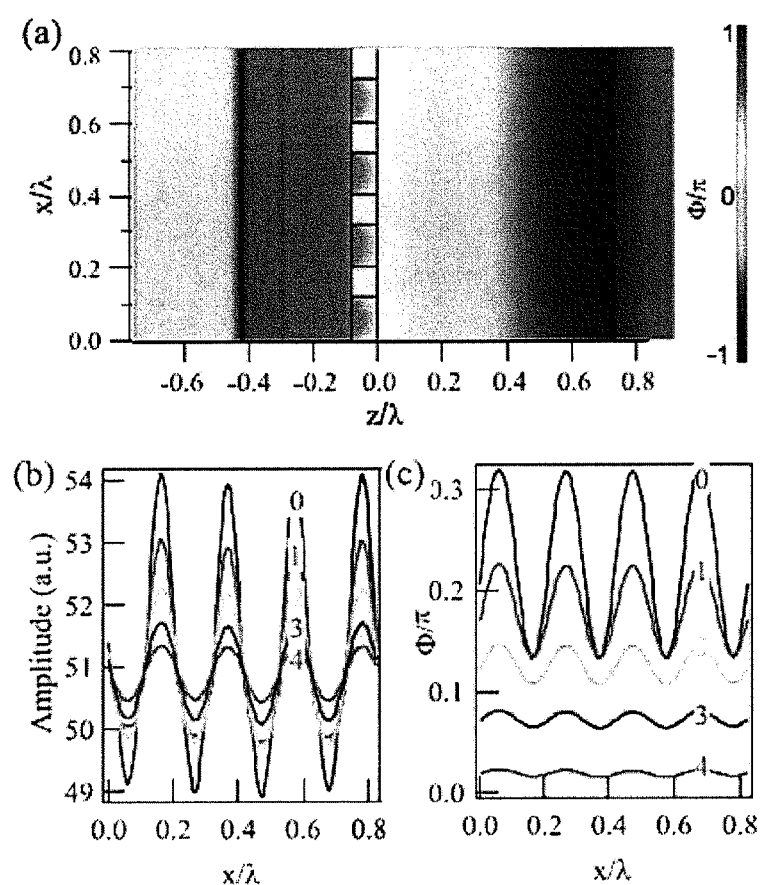
FIG. 11 is a graphical representation of the simulation of microwave field phase distribution in x-z plane for a grating, where the engraved channels with a period of $1/5\lambda$ are filled with a 1:1 water-isopropyl-alcohol mixture. Several cross sections along z for the amplitude and the phase are plotted in (b) and (c), respectively. The numbers of 0-4 denote $z=0, 1, 2, 3$, and 4 mm (0 to ~$0.11\lambda$), respectively.

Increasing the dielectric constants by filling the channels with water, the whole interference patterns shift and a much stronger contrast in a 2D PV mapping appears as shown in FIG. 10(b) compared with FIG. 10(a). The pronounced phase shift due to water significantly enhances the contrast of subwavelength features of the grating, which reveals the superiority of the 2D PV mapping including both the amplitude and the phase information. In order to understand the phase information from the 2D PV mapping, it is possible to separate the extracted phase ($\Phi_0$) into two parts: one part is the average of phase $\Phi_{avg}$ indicated by the dotted line in FIG. 10(d) and another part is the contrast of phase $\Delta\Phi$ indicated by the arrow, which represents the far- and near-field features, respectively. Notice $\Delta\Phi$ exponentially diminishes along z as demonstrated in FIG. 11(c), and leaves only the far-field feature $\Phi_{avg}$. Experimentally, both $\Phi_{avg}$ and $\Delta\Phi$ display a similar dependence on the water content (not shown) as that for "bulk" liquid in FIG. 9(d). This monotonic increase of $\Delta\Phi$ and $\Phi_{avg}$ with water content implies the possibility of drawing conclusions of molecular composition by near-field phase imaging. Similarly, it is possible to separate the oscillating amplitude of the PV into $B_{avg}$ and $\Delta B$ to characterize the far- and near-field properties, respectively. Notice that $B_{avg}$ and $\Delta B$ are almost constants for water rich mixtures (not shown) such as that in FIG. 9(c), and cannot be used to directly identify materials. Finally, the software COMSOL may be used to simulate microwave field distributions as shown in FIG. 11(a). A plane wave is excited with polarization perpendicular to the plane of the dielectric grating (along y). In order to reduce boundary effects and simulate an ideal grating the edges are set to be periodic. Then, using the finite element method, COMSOL solves Maxwell's equations for in plane field propagation and creates a phase mapping of the dielectric grating. The engraved channels in the grating with a period of $1/5\lambda$ are filled with a 1:1 water-isopropyl-alcohol mixture. Microwave fields are locally modulated in the grating because of the dielectric contrast, and result in a periodical subwavelength pattern as shown in FIG. 11(a). Because the subwavelength oscillating behaviors in both FIG. 11(b) and (c) are not dependent on the boundary condition, which do affect the specific evolution of subwavelength patterns from near- to far-field, no attempt is made to find a more appropriate boundary condition in order to achieve better agreement between experimental data and simulation shown in FIG. 10(c) and (c) in this letter.

The spatial evolution of the subwavelength patterns is shown in FIG. 11(b) and (c) for the amplitude and phase of microwave fields, respectively. In both cases, the oscillating modulation due to the dielectric contrast is restricted to the near-field ($0 \leq z \leq \lambda/5$) and disappears whenever $z > \lambda/2$. Notice that the contrast in both amplitude ($\Delta B$) and phase ($\Delta\Phi$) can be varied by dielectric constants, which shows a good agreement with the experimental data in FIG. 10(c) and (d).

In conclusion, an approach for local detection of sub-wavelength patterns of microwave fields has been demonstrated by adapting the interference principle into a spintronic sensor. Without any complex reconstruction algorithms, the 2D PV mapping shows the dielectric contrast in a scale far shorter than one microwave wavelength. Note despite several endeavors in near-field microwave imaging for biological application, progress is far behind the public expectation because of the lagging microwave sensor technology. If compared with optical imaging technologies revolutionized by microelectronics, the sensor employing spintronics makes the electrical and local phase detection become feasible in the microwave range, and implies a breakthrough for broad applications of microwave imaging.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A spintronic phase comparator apparatus comprising:
   a magnetic element;
   a first signal source;

a second signal source;

one or more first signal contacts, coupled to the magnetic element configured for receiving a first signal generated from the first signal source, along with a second signal generated from the second signal source;

one or more output contacts, coupled to the magnetic element, configured for providing a variable level voltage generated by the magnetic element, the level of the voltage being responsive to a phase difference between the first signal and the second signal; and storing the variable level voltage, as an output voltage of the spintronic phase comparator.

2. The spintronic phase comparator apparatus of claim 1, further comprising a substrate configured for mechanically supporting the magnetic element.

3. The spintronic phase comparator apparatus of claim 2, further comprising a conductor mechanically supported by the substrate, the conductor configured to receive the second signal.

4. The spintronic phase comparator apparatus of claim 3, further comprising an electrical insulator positioned in order to separate the conductor from the magnetic element.

5. The spintronic phase comparator apparatus of claim 4, where the electrical insulator is configured to electrically insulate the magnetic element from the conductor.

6. The spintronic phase comparator apparatus of claim 4, where the electrical insulator further comprises silicon dioxide ($SiO_2$).

7. The spintronic phase comparator apparatus of claim 3, further comprising one or more second signal contacts coupled to the conductor, the second signal contacts being configured to receive the second signal.

8. The spintronic phase comparator apparatus of claim 1, where the electrical conductor is copper.

9. The spintronic phase comparator apparatus of claim 1, where the electrically insulating substrate comprises silicon.

10. The spintronic phase comparator apparatus of claim 1, where the magnetic element has the magneto-resistance including at least one of anisotropic magneto-resistance, giant magneto-resistance, and tunneling magneto-resistance.

11. The spintronic phase comparator apparatus of claim 1, where the magnetic element comprises a Ferro magnet.

12. The spintronic phase comparator apparatus of claim 1, where a permalloy comprises the magnet element.

13. The spintronic phase comparator apparatus of claim 1, where the magnetic element comprises a ferromagnetic semiconductor material.

14. The spintronic phase comparator apparatus of claim 1, where the magnetic element comprises an electrically conductive material.

15. The spintronic phase comparator apparatus of claim 1, where the first signal and the second signal are both each electromagnetic signals having a frequency in the range of 0.1 GHz to 200 GHz.

16. A spintronic phase comparator system comprising:

a first signal source configured to provide a first signal;

a second signal source configured to provide a second signal; and a phase comparator device comprising:

a magnetic element supported on a substrate;

one or more first signal contacts, coupled to the magnetic element, that are configured for receiving a first signal;

one or more output contacts, coupled to the magnetic element, that are configured for providing a variable level voltage generated by the magnetic element, the level of the voltage being responsive to a phase difference between the first signal and the second signal; and storing the variable level voltage, as an output voltage of the spintronic phase comparator.

17. The spintronic phase comparator system of claim 16, further comprising a meter coupled to the spintronic phase comparator that is configured to measure the variable level voltage generated by the magnetic element.

18. The spintronic phase comparator system of claim 16, further comprising a conductor mechanically supported by the substrate, the conductor also being configured to receive the second signal.

19. The spintronic phase comparator system of claim 18, further comprising an electrical insulator positioned in order to separate the conductor from the magnetic element.

20. The spintronic phase comparator system of claim 19, where the electrical insulator is configured to electrically insulate the magnetic element from the conductor.

21. The spintronic phase comparator system of claim 19, where the electrical insulator further comprises silicon dioxide ($SiO_2$).

22. The spintronic phase comparator system of claim 18, further comprising one or more second signal contacts that are coupled onto the conductor, with the second signal contacts being configured to receive the second signal.

23. The spintronic phase comparator system of claim 16, where the electrical conductor is copper.

24. The spintronic phase comparator system of claim 16, where the electrically insulating substrate comprises silicon.

25. The spintronic phase comparator system of claim 16, where the first signal and the second signal are both each electromagnetic signals having a frequency in the range of 0.1 GHz to 200 GHz.

26. The spintronic phase comparator system of claim 16, further comprising a signal generator as the signal source that is configured for providing the first signal.

27. The spintronic phase comparator system of claim 16, where the second signal source comprises electromagnetic radiation that is either reflected or transmitted by an object in the near field.

28. The spintronic phase comparator system of claim 16, where the second signal source comprises electromagnetic radiation that is either reflected or transmitted by an object in the far field.

29. The spintronic phase comparator system of claim 16, further comprising a processing device configured to determine a dielectric function of an object in response to a phase difference between the first signal and the second signal, where the second signal comprises electromagnetic radiation reflected by the object.

30. The spintronic phase comparator system of claim 16, further comprising a processing device configured to determine a homogeneity of an object in response to a phase difference between the first signal and the second signal, where the second signal comprises electromagnetic radiation reflected by the object.

31. The spintronic phase comparator system of claim 16, further comprising an external magnetic field source for applying an external magnetic field to the phase comparator device.

32. A spintronic method of phase comparison that compares electromagnetic signals, using a spintronic phase comparator, the method comprising:

receiving a first signal from a first signal source at a magnetic element;

receiving a second signal from a second signal source; and generating, with the magnetic element, a variable level voltage, the level of the voltage being responsive to a phase difference between the first signal and a second signal; and storing the generated variable level voltage as an output voltage of the spintronic phase comparator.

33. The spintronic method of claim 32, further comprising measuring the voltage generated by the magnetic element before the variable level voltage is stored as an output voltage of the spintronic phase comparator.

34. The spintronic method of claim 33, further comprising repeatedly quantifying a phase difference between the first signal and the second signal in response to the variable voltage level being generated by the magnetic element as the first and second signals occur over time with the spintronic phase comparator.

35. The spintronic method of claim 32, where the second signal source comprises electromagnetic radiation that is being reflected by an object in the near field.

36. The spintronic method of claim 32, where the second signal source comprises electromagnetic radiation that is being reflected by an object in the far field.

37. A spintronic phase comparator method of manufacturing a spintronic phase comparator device, the method comprising:

providing a substrate;

providing a magnetic element coupled onto the substrate;

forming one or more first signal contacts, coupled to the magnetic element, configured for receiving a first signal generated from a first signal source, along with a second signal generated from a second signal source;

forming one or more output contacts, coupled to the magnetic element, that is/are configured for providing a variable level voltage, the level of the voltage being responsive to a phase difference between the first signal and the second signal; and storing the variable level voltage, as an output voltage of the spintronic phase comparator.

38. The spintronic phase comparator method of claim 37, further comprising providing a conductor coupled onto the electrically insulating substrate, the conductor being configured in order to receive the second signal from the second signal source.

39. The spintronic phase comparator method of claim 38, further comprising forming an electrical insulator positioned in order to separate the conductor from the magnetic element.

40. The spintronic phase comparator method of claim 38, further comprising forming one or more second signal contacts coupled onto the conductor, whereby the second signal contacts are configured in order to receive the second signal from the second signal source.

* * * * *